(12) United States Patent
Lin

(10) Patent No.: US 9,196,574 B2
(45) Date of Patent: Nov. 24, 2015

(54) SNUBBER CIRCUIT AND METHOD OF USING BIPOLAR JUNCTION TRANSISTOR IN SNUBBER CIRCUIT

(75) Inventor: Kuo-Fan Lin, Taoyuan County (TW)

(73) Assignee: FSP TECHNOLOGY INC., Taoyuan Dist., Taoyuan (TW)

( * ) Notice: Subject to any disclaimer, the term of this patent is extended or adjusted under 35 U.S.C. 154(b) by 446 days.

(21) Appl. No.: 13/612,846

(22) Filed: Sep. 13, 2012

(65) Prior Publication Data

US 2013/0063853 A1 Mar. 14, 2013

Related U.S. Application Data

(60) Provisional application No. 61/533,796, filed on Sep. 13, 2011, provisional application No. 61/682,319, filed on Aug. 13, 2012.

(30) Foreign Application Priority Data

Jan. 31, 2012 (TW) .............................. 101103040 A

(51) Int. Cl.
| | | |
|---|---|---|
| H02H 9/00 | (2006.01) | |
| H01L 23/495 | (2006.01) | |
| H01L 21/56 | (2006.01) | |
| H01L 23/62 | (2006.01) | |
| H01L 25/16 | (2006.01) | |
| H01L 23/498 | (2006.01) | |
| H01L 23/00 | (2006.01) | |
| H01L 23/31 | (2006.01) | |

(52) U.S. Cl.
CPC ............ *H01L 23/4952* (2013.01); *H01L 21/56* (2013.01); *H01L 23/498* (2013.01); *H01L 23/49562* (2013.01); *H01L 23/62* (2013.01); *H01L 24/06* (2013.01); *H01L 24/14* (2013.01); *H01L 24/49* (2013.01); *H01L 25/16* (2013.01); *H01L 23/3107* (2013.01); *H01L 24/13* (2013.01); *H01L 24/16* (2013.01); *H01L 24/29* (2013.01); *H01L 24/32* (2013.01); *H01L 24/45* (2013.01); *H01L 24/48* (2013.01); *H01L 24/73* (2013.01); *H01L 2224/0401* (2013.01); *H01L 2224/0603* (2013.01); *H01L 2224/13111* (2013.01); *H01L 2224/1403* (2013.01); *H01L 2224/14051* (2013.01); *H01L 2224/16106* (2013.01); *H01L 2224/16245* (2013.01); *H01L 2224/29339* (2013.01); *H01L 2224/32013* (2013.01); *H01L 2224/32245* (2013.01); *H01L 2224/45144* (2013.01); *H01L 2224/4813* (2013.01);

(Continued)

(58) Field of Classification Search
CPC ... H02M 1/34; H02M 2001/348; H02M 1/32; H03K 17/08142; H03K 17/08144
USPC .......................................................... 361/91.7
See application file for complete search history.

(56) References Cited

U.S. PATENT DOCUMENTS 5,828,559 A * 10/1998 Chen .......................... 363/56.05
5,917,241 A    6/1999 Nakayama (Continued)

*Primary Examiner* — Stephen W Jackson
(74) *Attorney, Agent, or Firm* — Winston Hsu; Scott Margo

(57) ABSTRACT

A snubber circuit includes: a capacitor including a first terminal and a second terminal, where the first terminal of the capacitor is electrically connected to a first terminal of the snubber circuit; and a Bipolar Junction Transistor (BJT), where one of the emitter and the collector of the BJT is electrically connected to the second terminal of the capacitor, and the other one of the emitter and the collector of the BJT is electrically connected to a second terminal of the snubber circuit. The snubber circuit can be electrically connected in parallel to an active component or a load to protect the circuitry connected to the load, and more particularly to absorb spike or noise generated during high-frequency switching of the active component to recycle energy, in order to achieve the goal of reducing spike voltages and enhancing efficiency.

9 Claims, 8 Drawing Sheets

(52) U.S. Cl.
CPC ............. *H01L2224/48091* (2013.01); *H01L 2224/48247* (2013.01); *H01L 2224/49107* (2013.01); *H01L 2224/49113* (2013.01); *H01L 2224/73265* (2013.01); *H01L 2924/1301* (2013.01); *H01L 2924/1305* (2013.01); *H01L 2924/1306* (2013.01); *H01L 2924/13055* (2013.01); *H01L 2924/13091* (2013.01); *H01L 2924/181* (2013.01); *H01L 2924/3011* (2013.01)

(56) References Cited

U.S. PATENT DOCUMENTS

| | | | |
|---|---|---|---|
| 6,040,626 A | 3/2000 | Cheah | |
| 6,054,716 A | 4/2000 | Sonobe | |
| 6,473,318 B1 | 10/2002 | Qian et al. | |
| 7,843,048 B2 | 11/2010 | Galera | |
| 8,324,025 B2 | 12/2012 | Saboco | |
| 8,941,962 B2* | 1/2015 | Lin | 361/91.5 |
| 2002/0079592 A1 | 6/2002 | Lo | |
| 2004/0085068 A1* | 5/2004 | Zhu et al. | 324/382 |
| 2004/0240128 A1 | 12/2004 | Boselli | |
| 2006/0038810 A1* | 2/2006 | Ebata et al. | 345/213 |
| 2006/0072259 A1* | 4/2006 | Yunus | 361/56 |
| 2008/0067601 A1 | 3/2008 | Chen | |
| 2009/0244848 A1 | 10/2009 | Lim | |
| 2009/0258458 A1 | 10/2009 | Zhang | |
| 2011/0013426 A1* | 1/2011 | Keller | 363/21.15 |
| 2011/0303947 A1* | 12/2011 | Salcedo et al. | 257/173 |
| 2012/0032319 A1 | 2/2012 | Dunipace | |
| 2012/0168839 A1 | 7/2012 | Perng | |
| 2012/0194953 A1* | 8/2012 | Mikolajczak | 361/56 |

* cited by examiner

SNUBBER CIRCUIT AND METHOD OF USING BIPOLAR JUNCTION TRANSISTOR IN SNUBBER CIRCUIT

CROSS REFERENCE TO RELATED APPLICATIONS

This application claims the benefit of U.S. provisional application No. 61/533,796 (filed on Sep. 13, 2011) and U.S. provisional application No. 61/682,319 (filed on Aug. 13, 2012). The entire contents of the related applications are incorporated herein by reference.

BACKGROUND OF THE INVENTION

1. Field of the Invention

The disclosed embodiments of the present invention relate to protecting circuits of power/electronic components, and more particularly, to a snubber circuit and a method for applying a bipolar junction transistor (BJT) to a snubber circuit.

2. Description of the Prior Art

As the electronic circuit technology continues to develop in recent years, various protecting circuits of power/electronic components are widely implemented in many applications. Therefore, the protecting circuit design becomes a very popular topic. In conventional protecting circuits, some snubber circuits are widely employed in power/electronic circuits due to the simple architecture and easy implementation. However, there are still disadvantages/drawbacks in these conventional snubber circuits. For instance, the power consumption of the conventional snubber circuit is quite high, and the efficiency is usually poor. Moreover, the conventional snubber circuit can not ensure the restriction of the highest voltage surge. In other words, the voltage surge may exceed the range that the whole circuit can afford. As a result, the semiconductor component may be damaged due to utilizing the conventional snubber circuit.

Therefore, there is a need for a novel method to improve the circuit protection performance of the snubber circuit.

SUMMARY OF THE INVENTION

Thus, one objective of the present invention is to provide a snubber circuit and a method for applying a BJT to a snubber circuit to solve the problem mentioned above.

Another objective of the present invention is to provide a snubber circuit and a method for applying a BJT to a snubber circuit for protecting the circuit connected to the load, reducing voltage surge and improving the efficiency.

The preferred embodiment of the present invention provides a snubber circuit. The disclosed snubber circuit includes a capacitor and a bipolar junction transistor (BJT). The capacitor has a first terminal and a second terminal, wherein the first terminal of the capacitor is electrically connected to a first terminal of the snubber circuit. Moreover, one of an emitter and a collector of the BJT is electrically connected to the second terminal of the capacitor, and another of the emitter and the collector of the BJT is electrically connected to a second terminal of the snubber circuit.

The preferred embodiment of the present invention provides another snubber circuit. The disclosed snubber circuit includes a first capacitor, a resistor and a bipolar junction transistor (BJT). The first capacitor has a first terminal and a second terminal, wherein the first terminal of the first capacitor is electrically connected to a first terminal of the snubber circuit. The resistor has a first terminal and a second terminal, wherein the first terminal of the resistor is electrically connected to the second terminal of the first capacitor. Moreover, one of an emitter and a collector of the BJT is electrically connected to the second terminal of the resistor, and another of the emitter and the collector of the capacitor is electrically connected to a second terminal of the snubber circuit.

The preferred embodiment of the present invention also provides a method for applying a bipolar junction transistor (BJT) to a snubber circuit. The method includes: conducting a base and an emitter of the BJT; and based on at least one junction characteristic between the base and the collector of the BJT, utilizing the BJT as a fast diode in the snubber circuit, wherein the step of utilizing the BJT as a fast diode in the snubber circuit includes: electrically connecting one of the emitter and the collector of the BJT to a terminal of a capacitor; electrically connecting an another terminal of the capacitor to a first terminal of the snubber circuit; and electrically connecting another of the emitter and the collector of the BJT to a second terminal of the snubber circuit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
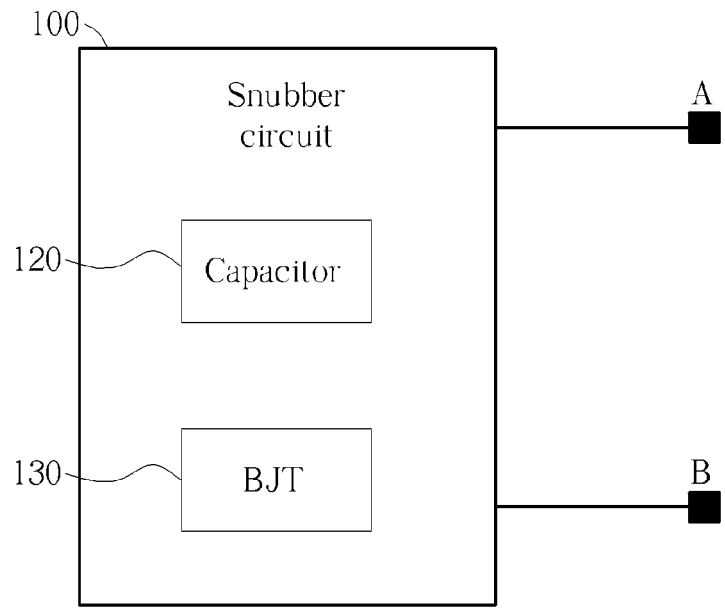
FIG. 1 is a diagram illustrating a snubber circuit according to a first embodiment of the present invention.

FIG. 1 is a diagram illustrating a snubber circuit 100 according to a first embodiment of the present invention. The snubber circuit 100 is a capacitor-bipolar junction transistor (BJT) snubber circuit. Hence, the snubber circuit 100 can be referred to as a CB snubber. In this embodiment, the snubber circuit 100 includes a capacitor 120 and a BJT 130. Specifically, the capacitor 120 has a first terminal and a second terminal, wherein the first terminal of the capacitor 120 is electrically connected to a first terminal of the snubber circuit 100, and one of an emitter and a collector of the BJT 130 is electrically connected to the second terminal of the capacitor 120, and another of the emitter and the collector of the BJT 130 is electrically connected to a second terminal of the snubber circuit 100. In practice, the base and the emitter of the BJT 130 are both electrically conducted.

According to this embodiment, a method for applying the BJT 130 to a snubber circuit (e.g., the snubber circuit 100) may include at least the following steps: conducting the base and the emitter of the BJT; and based on at least one junction characteristic between the base and the collector of the BJT, utilizing the BJT as a fast diode in the snubber circuit, wherein the step of utilizing the BJT as a fast diode includes: electrically connecting one of the emitter and the collector of the BJT 130 to a terminal of a capacitor 120 (especially the second terminal of the capacitor 120 in this embodiment); electrically connecting another terminal of the capacitor 120 to a terminal (e.g., a first terminal A) of the snubber circuit 100; and electrically connecting another of the emitter and the collector of the BJT 130 to a second terminal B of the snubber circuit 100. Specifically, the at least one junction characteristic includes a characteristic of fast turning on, a characteristic of long storage time, a characteristic of slow switching and a characteristic of small base-collector junction capacitance $C_{BC}$, and the step of utilizing the BJT as a fast diode further includes: transferring the leakage-inductor energy to a capacitor of the snubber circuit rapidly by using the characteristic of fast turning on, pushing the energy of the capacitor back to the source by using the characteristic of long storage time, and then reducing the resonance amplitude by using the characteristic of slow switching and the characteristic of small base-collector junction capacitance $C_{bc}$.

FIG. 2 to FIG. 5 are diagrams illustrating details of different embodiments of the snubber circuit 100 in FIG. 1, wherein the embodiments in FIG. 2 to FIG. 5 correspond to $TYPE_1$, $TYPE_2$, $TYPE_3$, and $TYPE_4$, respectively. For better understanding and clearer illustration of technical features of the present invention, the snubber circuits shown in FIG. 2 to FIG. 5 can be labeled as snubber circuits 100A, 100B, 100C, and 100D, respectively.

Figure 2:
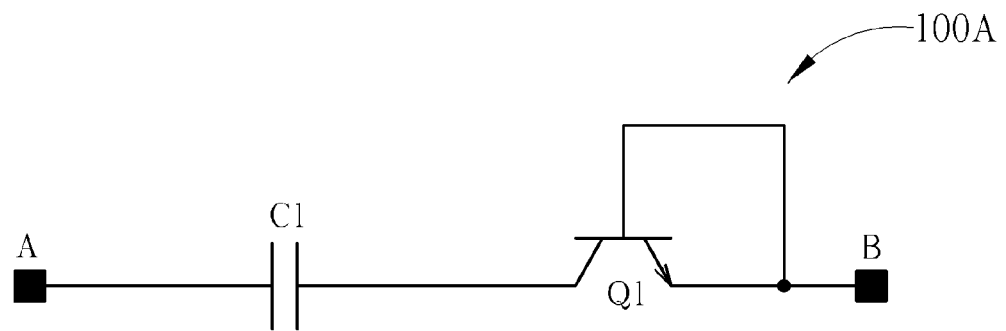
FIG. 2 is a diagram illustrating the details of different embodiments of the snubber circuit in FIG. 1.

As shown in FIG. 2, the snubber circuit 100A includes a capacitor C1 and a BJT Q1, wherein the base and the emitter of the BJT Q1 are both electrically conducted and electrically connected to a second terminal B of the snubber circuit 100A. The collector of the BJT Q1 is electrically connected to a terminal of the capacitor C1 (corresponding to the second terminal of the capacitor 120 shown in FIG. 1), and another terminal of the capacitor C1 (which corresponds to the first terminal of the capacitor 120 shown in FIG. 1) is electrically connected to a first terminal A of the snubber circuit 100A.

Figure 3:
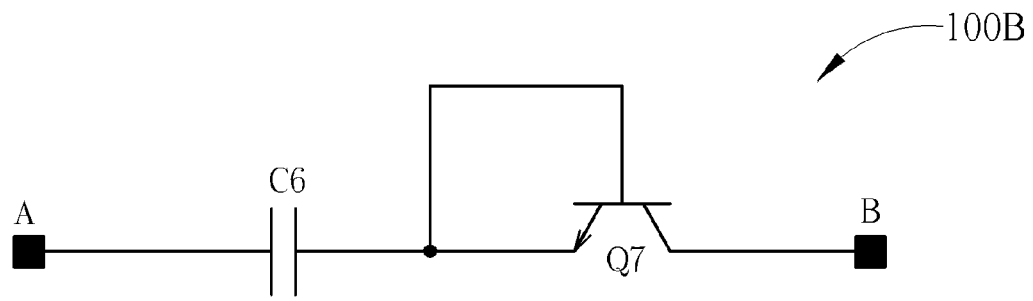
FIG. 3 is a diagram illustrating the details of different embodiments of the snubber circuit in FIG. 1.

As shown in FIG. 3, the snubber circuit 100B includes a capacitor C6 and a BJT Q7, wherein the base and the emitter of the BJT Q7 are electrically conducted and electrically connected to a terminal of the capacitor C6 (which corresponds to the second terminal of the capacitor 120 shown in FIG. 1), and the collector of the BJT Q7 is electrically connected to a second terminal B of the snubber circuit 100B, and another terminal of the capacitor C6 (which corresponds to the first terminal of the capacitor 120 shown in FIG. 1) is electrically connected to a first terminal A of the snubber circuit 100B.

Figure 4:
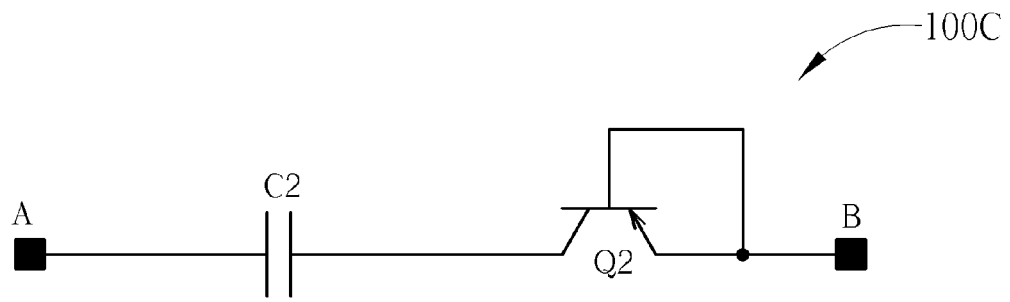
FIG. 4 is a diagram illustrating the details of different embodiments of the snubber circuit in FIG. 1.

As shown in FIG. 4, the snubber circuit 100C includes a capacitor C2 and a BJT Q2, wherein the base and the emitter of the BJT Q2 are both electrically conducted and electrically connected to a second terminal B of the snubber circuit 100C. The collector of the BJT Q2 is electrically connected to a terminal of the capacitor C2 (which corresponds to the second terminal of the capacitor 120 shown in FIG. 1), and another terminal of the capacitor C2 (which corresponds to the first terminal of the capacitor 120 shown in FIG. 1) is electrically connected to a first terminal A of the snubber circuit 100C.

Figure 5:
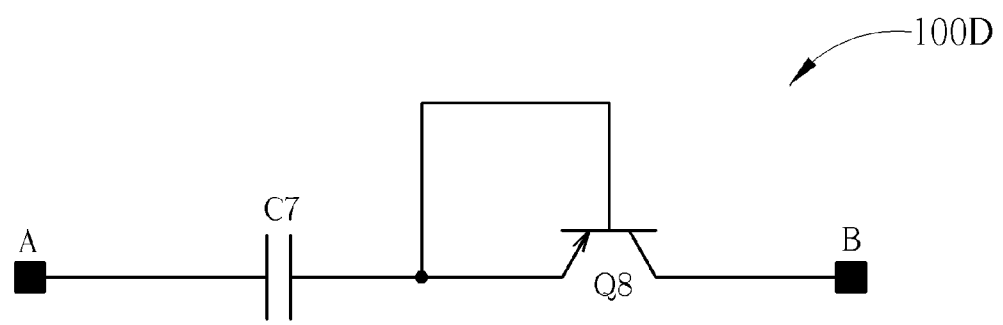
FIG. 5 is a diagram illustrating the details of different embodiments of the snubber circuit in FIG. 1.

As shown in FIG. 5, the snubber circuit 100D includes a capacitor C7 and a BJT Q8, wherein the base and the emitter of the BJT Q8 are electrically conducted and electrically connected to a terminal of the capacitor C7 (which corresponds to the second terminal of the capacitor 120 shown in FIG. 1), the collector of the BJT Q8 is electrically connected to a second terminal B of the snubber circuit 100D, and another terminal of the capacitor C7 (which corresponds to the first terminal of the capacitor 120 shown in FIG. 1) is electrically connected to a first terminal A of the snubber circuit 100D.

In accordance with some of the modifications of some embodiments of the present invention, such as the above-mentioned embodiments, The snubber circuit 100 can adjust the voltage Vab (i.e., the voltage across the terminal A and the terminal B) dynamically. The snubber circuit 100 may use the BJT 130 as a fast diode according to the at least one junction characteristic mentioned above. Especially, the snubber circuit 100 may transfer the leakage inductor energy to a capacitor of the snubber circuit rapidly by using the characteristic of fast turning on, push the energy of the capacitor back to the source by using the characteristic of long storage time, and reduce the resonance amplitude by using the characteristic of slow switching and the characteristic of small base-collector junction capacitance $C_{bc}$.

FIG. 6-FIG. 9 are diagrams illustrating different types of a snubber circuit according to a second embodiment of the present invention, in which the snubber circuit is a resistor-capacitor-BJT snubber circuit and may be referred to as an RCB snubber. Compared to the first embodiment, at least a resistor is disposed in the snubber circuit of the second embodiment. Especially, the snubber circuit in the second embodiment includes a first capacitor (e.g., capacitor 120), a resistor and a BJT (e.g., BJT 130), wherein the first capacitor has a first terminal and a second terminal, the first terminal of the first capacitor is electrically connected to a first terminal (e.g., a first terminal A) of the snubber circuit, and the resistor has a first terminal and a second terminal. Besides, one of the emitter and the collector of the BJT is electrically connected to the second terminal of the resistor, and another of the emitter and the collector of the BJT is electrically connected to a second terminal (e.g., a second terminal B) of the snubber circuit. In practice, the base and the emitter of the BJT 130 are both electrically conducted.

Figure 6:
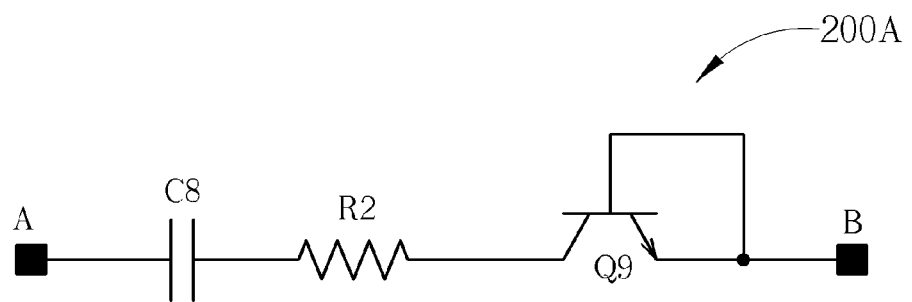
FIG. 6 is a diagram illustrating different types of a snubber circuit according to a second embodiment of the present invention.

As shown in FIG. 6, the snubber circuit 200A includes a capacitor C8, a resistor R2, and a BJT Q9, wherein the base and the emitter of the BJT Q9 are both electrically conducted and electrically connected to a second terminal B of the snubber circuit 200A, the collector of the BJT Q9 is electrically connected to the second terminal of the resistor R2, a first terminal of the resistor R2 is electrically connected to a second terminal of the capacitor C8, and a first terminal of the capacitor C8 is electrically connected to a first terminal A of the snubber circuit 200A.

Figure 7:
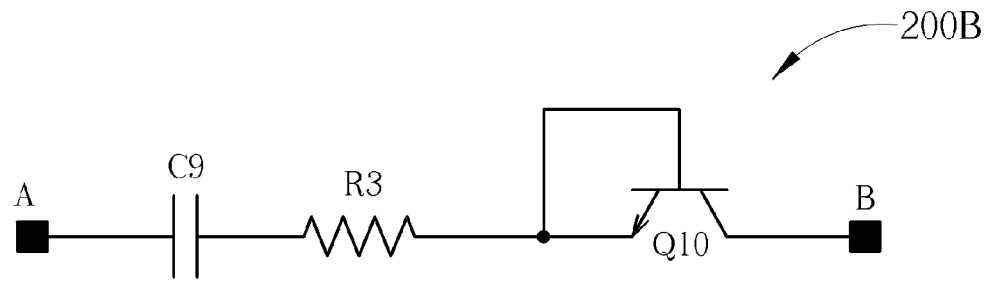
FIG. 7 is a diagram illustrating different types of a snubber circuit according to a second embodiment of the present invention.

As shown in FIG. 7, the snubber circuit 200B includes a capacitor C9, a resistor R3, and a BJT Q10, wherein the base and the emitter of the BJT Q10 are both electrically conducted and electrically connected to a second terminal of the resistor R3, the collector of the BJT Q10 is electrically connected to the second terminal B of the snubber circuit 200B, a first terminal of the resistor R3 is electrically connected to a second terminal of the capacitor C9, and a first terminal of the capacitor C9 is electrically connected to a first terminal A of the snubber circuit 200B.

Figure 8:
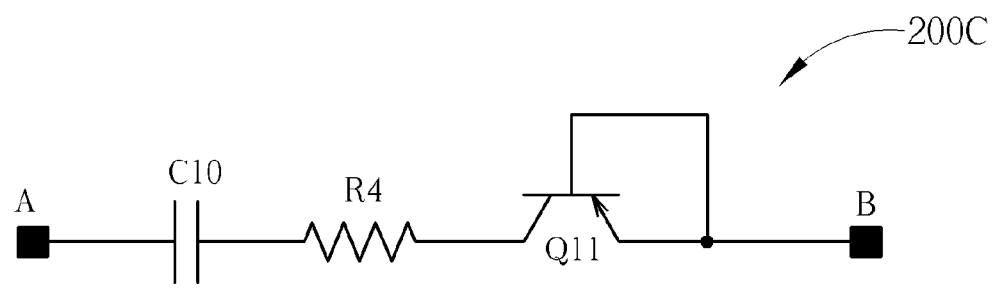
FIG. 8 is a diagram illustrating different types of a snubber circuit according to a second embodiment of the present invention.

As shown in FIG. 8, the snubber circuit 200C includes a capacitor C10, a resistor R4, and a BJT Q11, wherein the base and the emitter of the BJT Q11 are both electrically conducted and electrically connected to a second terminal B of the snubber circuit 200C, the collector of the BJT Q11 is electrically connected to the second terminal of the resistor R4, a first terminal of the resistor R4 is electrically connected to a second terminal of the capacitor C10, and a first terminal of the capacitor C10 is electrically connected to a first terminal A of the snubber circuit 200C.

Figure 9:
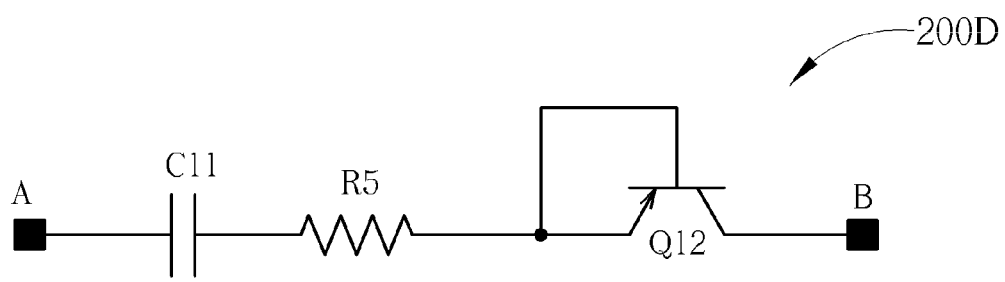
FIG. 9 is a diagram illustrating different types of a snubber circuit according to a second embodiment of the present invention.

As shown in FIG. 9, the snubber circuit 200D includes a capacitor C11, a resistor R5, and a BJT Q12, wherein the base and the emitter of the BJT Q12 are both electrically conducted and electrically connected to a second terminal of the resistor R5, the collector of the BJT Q12 is electrically connected to the second terminal B of the snubber circuit 200D, a first terminal of the resistor R5 is electrically connected to a second terminal of the capacitor C11, and a first terminal of the capacitor C11 is electrically connected to a first terminal A of the snubber circuit 200D.

The first embodiment and the second embodiment of the snubber circuits 100A-100D, 200A-200D mentioned above are connected to an active component or a load in parallel, wherein the active component is or is assembled by a Metal Oxide Semiconductor Field Effect Transistor (MOSFET), a diode, a Bipolar Junction Transistor (BJT), an Insulated Gate Bipolar Transistor (IGBT), a Static Induction Transistor (SIT), or a thyristor, and the load is or is assembled by an inductor, a resistor, or a capacitor.

Figure 10:
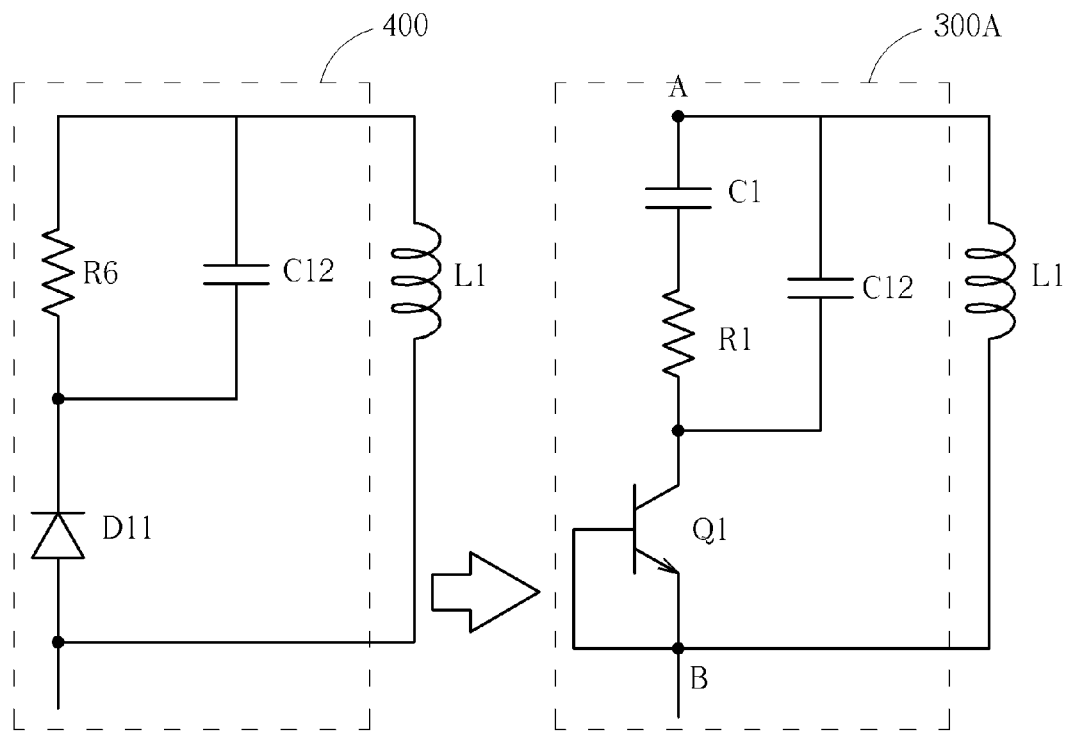
FIG. 10 is a diagram illustrating some experimental structures associated with an embodiment of the snubber circuit shown in FIG. 6.

FIG. 10 is a diagram illustrating some experimental structures associated with an embodiment of the snubber circuit 200A shown in FIG. 6, wherein the structure shown in the right side of FIG. 10 is the snubber circuit 300A according to this embodiment of the present invention, and the snubber circuit 400 shown in the left side of FIG. 10 is a conventional structure (which may be regarded as a conventional RCD snubber circuit) using diodes for comparison purpose. For better understanding and clearer illustration of technical features of the present invention, FIG. 10 shows snubber circuits 300A, 400 connected to an inductor L1 in parallel, wherein the inductor L1 is used as a load in this embodiment. The load may be a resistor or a capacitor, or may be assembled by a resistor and/or a capacitor. According to this embodiment, when compared to the RCB snubber circuit mentioned above (e.g., the snubber circuit 200A shown in FIG. 6), the snubber circuit 300A further includes a capacitor C12, wherein the capacitor C12 is connected to a first terminal of the capacitor and a second terminal of the resistor R1 in parallel, and the capacitor C12 may be used for resisting small electrical noise due to that the capacitance of the capacitor C1 is greater than that of the capacitor C12. Especially, in this embodiment, the BJT Q1 may be model KSP44 manufactured by Fairchild Semiconductor, and the diode D11 may be model 1N4007 manufactured by Fairchild Semiconductor, ON Semiconductor, or Diodes Incorporated. The resistance values of the resistor R1 and the resistor RE may be 10 Ohm and 100 k Ohm, respectively. The capacitance values of the capacitor C12 and the capacitor C1 may be 2.2 Nano-Farad and 10 Nano-Farad, respectively. The BJT Q1 (i.e., model KSP44) has the following specification: the maximum voltage $V_{CEO}$ of the collector-emitter is 400V, the maximum voltage $V_{EBO}$ of the emitter-base is 6V, and the collector current $I_C$ is 300 mA. However, this is for illustrative purpose only, and is not meant to be a limitation of the preset invention.

Figure 11:
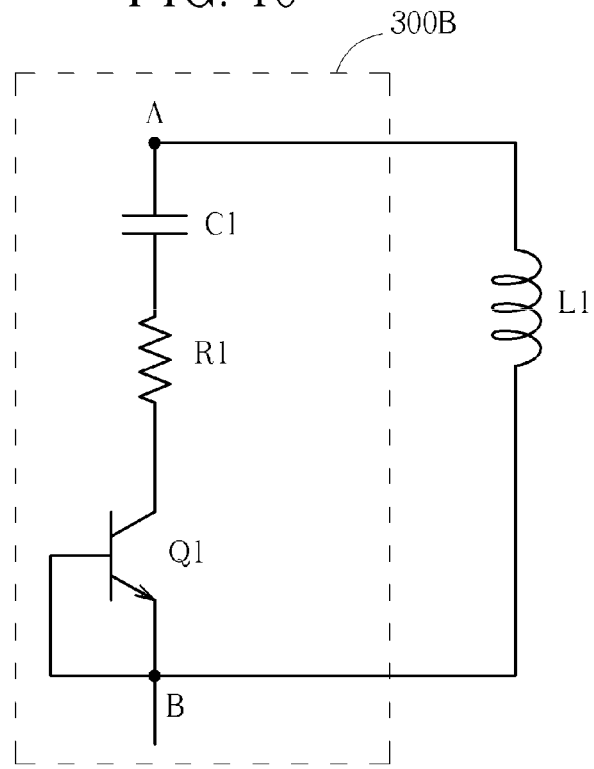
FIG. 11 is a diagram illustrating a modification of the snubber circuit.
Figure 12:
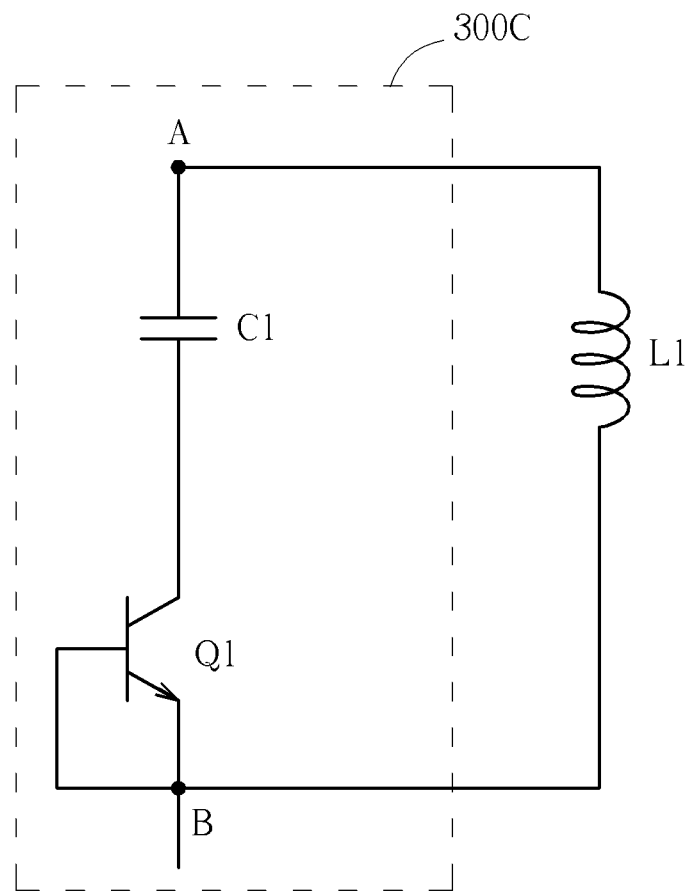
FIG. 12 is a diagram illustrating a modification of the snubber circuit.

In accordance with some of the modifications of this embodiment, such as the embodiments shown in FIG. 11-FIG. 12, the capacitor C12 may be removed from the snubber circuit 300A shown in the right side of FIG. 10, that is to say, the snubber circuit 300B may operate normally in a situation where the capacitor C12 does not exist. For instance, in the embodiment shown in FIG. 11, the resistance value of the resistor R1 may be in a range from 0 Ohm to ∞ Ohm. Preferably, the resistance value of the resistor R1 is in a range from 100 Ohm to 200 Ohm. Another example is that, in the embodiment shown in FIG. 12, the resistor R1 may be regarded as being removed/omitted in a situation where the resistance value of the resistor R1 is 0. That is to say, the snubber circuit 300C may operate normally in a situation where the resistor R1 and the capacitor C12 do not exist, wherein the snubber circuit 300C of this embodiment is identical to the structure of the CB snubber circuit shown in FIG. 2.

According to the testing results listed in Table 1-Table 6, the efficiency of the snubber circuit 300A shown in the right side of FIG. 10 (whose testing result is shown in Table 2, Table 4, and Table 6) is proved to be better than the efficiency of the snubber circuit 400 shown in the left side of FIG. 10 (whose testing result is shown in Table 1, Table 3, and Table 5) based on the experiment according to the embodiment shown in FIG. 10. The parameters Input_Voltage and Load_indicate the input voltage and the load in each one of Table 1-Table 6, in which Table 1 & Table 2 show testing results of the input voltage Input_Voltage=90 Vac, Table 3 & Table 4 show testing results of the input voltage Input_Voltage=100 Vac, and Table 5 & Table 6 show testing results of the input voltage Input_Voltage=115 Vac. Moreover, the parameter Percent_of_Rated_Load indicates percent of rated load (e.g., 1%, 2%, . . . , 100%). In addition, the following parameters Output_Current, Output_Voltage, Efficiency_, and Average_Efficiency indicate output current, output voltage, efficiency, and average efficiency respectively, wherein the average efficiency is 25%, 50%, 75%, and 100% of the rated load.

TABLE 1

| Input_Voltage (V) = 90 Vac | Load_ | | | | | | | | | | | |
|---|---|---|---|---|---|---|---|---|---|---|---|---|
| Percent_of_Rated_Load | 1% | 2% | 3% | 4% | 5% | 6% | 7% | 20% | 25% | 50% | 75% | 100% |
| Output_Current (A) | 0.013 | 0.0259 | 0.0516 | 0.0777 | 0.1038 | 0.1298 | 0.1557 | 0.4608 | 0.576 | 1.158 | 1.727 | 2.302 |
| Output_Voltage (V) | 19.265 | 19.262 | 19.26 | 19.257 | 19.257 | 19.257 | 19.255 | 19.24 | 19.232 | 19.2 | 19.19 | 19.14 |
| Efficiency_(%) | 57.84% | 68.15% | 74.17% | 77.93% | 80.60% | 81.15% | 83.05% | 88.22% | 88.48% | 89.15% | 88.61% | 87.94% |
| Average_Efficiency_(%) | | | | — | | | | | | 88.55% | | |

TABLE 2

| Input_Voltage (V) = 90 Vac | Load | | | | | | | | | | |
|---|---|---|---|---|---|---|---|---|---|---|---|
| Percent_of_Rated_Load | 1% | 2% | 3% | 4% | 5% | 6% | 7% | 20% | 25% | 50% | 75% | 100% |
| Output_Current (A) | 0.013 | 0.0256 | 0.0516 | 0.0777 | 0.1038 | 0.1298 | 0.1558 | 0.46 | 0.575 | 1.1506 | 1.7262 | 2.303 |
| Output_Voltage (V) | 19.257 | 19.257 | 19.255 | 19.252 | 19.25 | 19.25 | 19.247 | 19.232 | 19.227 | 19.192 | 19.16 | 19.13 |
| Efficiency_(%) | 68.59% | 78.5% | 83.42% | 84.99% | 86.13% | 86.76% | 87.68% | 89.45% | 89.52% | 89.04% | 88.67% | 88.11% |
| Average_Efficiency_(%) | | | | — | | | | | | 88.84% | | |

TABLE 3

| Input_Voltage (V) = 100 Vac | Load | | | | | | | | | | |
|---|---|---|---|---|---|---|---|---|---|---|---|
| Percent_of_Rated_Load | 1% | 2% | 3% | 4% | 5% | 6% | 7% | 20% | 25% | 50% | 75% | 100% |
| Output_Current (A) | 0.013 | 0.0256 | 0.0516 | 0.0777 | 0.1038 | 0.1298 | 0.1557 | 0.46 | 0.575 | 1.1518 | 1.7268 | 2.303 |
| Output_Voltage (V) | 19.257 | 19.257 | 19.257 | 19.255 | 19.255 | 19.255 | 19.252 | 19.22 | 19.215 | 19.18 | 19.16 | 19.135 |
| Efficiency_(%) | 57.03% | 68.80% | 73.82% | 77.92% | 79.00% | 82.21% | 82.35% | 88.50% | 88.89% | 89.44% | 89.18% | 88.67% |
| Average_Efficiency_(%) | | | | — | | | | | | 89.04% | | |

TABLE 4

| Input_Voltage (V) = 100 Vac | Load | | | | | | | | | | |
|---|---|---|---|---|---|---|---|---|---|---|---|
| Percent_of_Rated_Load | 1% | 2% | 3% | 4% | 5% | 6% | 7% | 20% | 25% | 50% | 75% | 100% |
| Output_Current (A) | 0.013 | 0.0256 | 0.0516 | 0.0777 | 0.1038 | 0.1298 | 0.1558 | 0.46 | 0.575 | 1.1506 | 1.7262 | 2.303 |
| Output_Voltage (V) | 19.252 | 19.255 | 19.252 | 19.25 | 19.247 | 19.245 | 19.254 | 19.23 | 19.223 | 19.19 | 19.16 | 19.125 |
| Efficiency_(%) | 68.20% | 77.75% | 83.34% | 84.98% | 87.62% | 86.65% | 87.67% | 89.81% | 89.86% | 89.65% | 89.15% | 88.98% |
| Average_Efficiency_(%) | | | | — | | | | | | 89.41% | | |

TABLE 5

| Input_Voltage (V) = 115 Vac | Load | | | | | | | | | | |
|---|---|---|---|---|---|---|---|---|---|---|---|
| Percent_of_Rated_Load | 1% | 2% | 3% | 4% | 5% | 6% | 7% | 20% | 25% | 50% | 75% | 100% |
| Output_Current (A) | 0.013 | 0.0256 | 0.0516 | 0.0777 | 0.1038 | 0.1298 | 0.1557 | 0.46 | 0.576 | 1.1518 | 1.7268 | 2.303 |
| Output_Voltage (V) | 19.265 | 19.265 | 19.26 | 19.257 | 19.26 | 19.252 | 19.252 | 19.24 | 19.232 | 19.202 | 19.17 | 19.14 |
| Efficiency_(%) | 56.92% | 65.76% | 73.07% | 77.13% | 79.65% | 80.87% | 82.80% | 88.24% | 88.91% | 89.43% | 89.47% | 89.23% |
| Average_Efficiency_(%) | | | | — | | | | | | 89.26% | | |

TABLE 6

| Input_Voltage (V) = 115 Vac | Load | | | | | | | | | | |
|---|---|---|---|---|---|---|---|---|---|---|---|
| Percent_of_Rated_Load | 1% | 2% | 3% | 4% | 5% | 6% | 7% | 20% | 25% | 50% | 75% | 100% |
| Output_Current (A) | 0.013 | 0.0256 | 0.0516 | 0.0777 | 0.1038 | 0.1298 | 0.1558 | 0.46 | 0.575 | 1.1506 | 1.7262 | 2.303 |
| Output_Voltage (V) | 19.25 | 19.247 | 19.245 | 19.24 | 19.24 | 19.237 | 19.235 | 19.217 | 19.215 | 19.182 | 19.153 | 19.127 |
| Efficiency_(%) | 65.86% | 76.27% | 82.75% | 83.99% | 85.35% | 86.07% | 87.12% | 89.93% | 90.19% | 89.72% | 90.09% | 89.53% |
| Average_Efficiency_(%) | | | | — | | | | | | 89.88% | | |

According to the testing results listed in Table 1-Table 6, the efficiency of the snubber circuit 300A shown in the right side of FIG. 10 (whose testing result is shown in Table 2, Table 4, and Table 6) is proved to be better than the efficiency of the snubber circuit 400 shown in the left side of FIG. 10 (whose testing result is shown in Table 1, Table 3, and Table 5) based on the experiment, especially in a situation that the snubber circuit is electrically connected to a light load. The light load indicates that the percent of rated load is smaller than or equal to 20%, namely the load accounts for less than 20% of the full load. For instance, the percent of rated load is 1%-20%. As can be known from the testing results of Table 1-Table 6, the efficiency of the snubber circuit 300A of the embodiment is far better than the efficiency of the snubber circuit 400 shown in the left side of FIG. 10. For instance, referring to Table 1 and Table 2, the efficiency of Table 2 (the snubber circuit 300A) is 10.57% (57.48%-68.59%) higher than the efficiency of Table 1 (the snubber circuit 400) under a condition that the percent of rated load of both Table 1 and Table 2 is 1%. And the efficiency of Table 2 is 1.23% (88.22%-89.45%) higher than the efficiency of Table 1 under a condition that the percent of rated load of both Table 1 and Table 2 is 20%.

Thus, compared to the conventional RCD snubber circuit (e.g., the snubber circuit 400), the efficiency of the snubber circuit 300A of the present embodiment is improved when the load is a light load. Hence, the snubber circuit of the present is particularly suitable for a no-load case or a light load case, and may be set in a low-power adapter or a low-power power supply. The snubber circuit of this embodiment has a dramatic improvement in efficiency. Besides, according to Average_Efficiency in Table 1-Table 6, there is also a slight increase on the average efficiency by 0.3%-0.6% when the load is a heavy load (25%-100%). Therefore, compared to a power supply using an RCD snubber circuit, a power supply using the snubber circuit of the present invention is more efficient, particularly in a light load condition.

Figure 13:
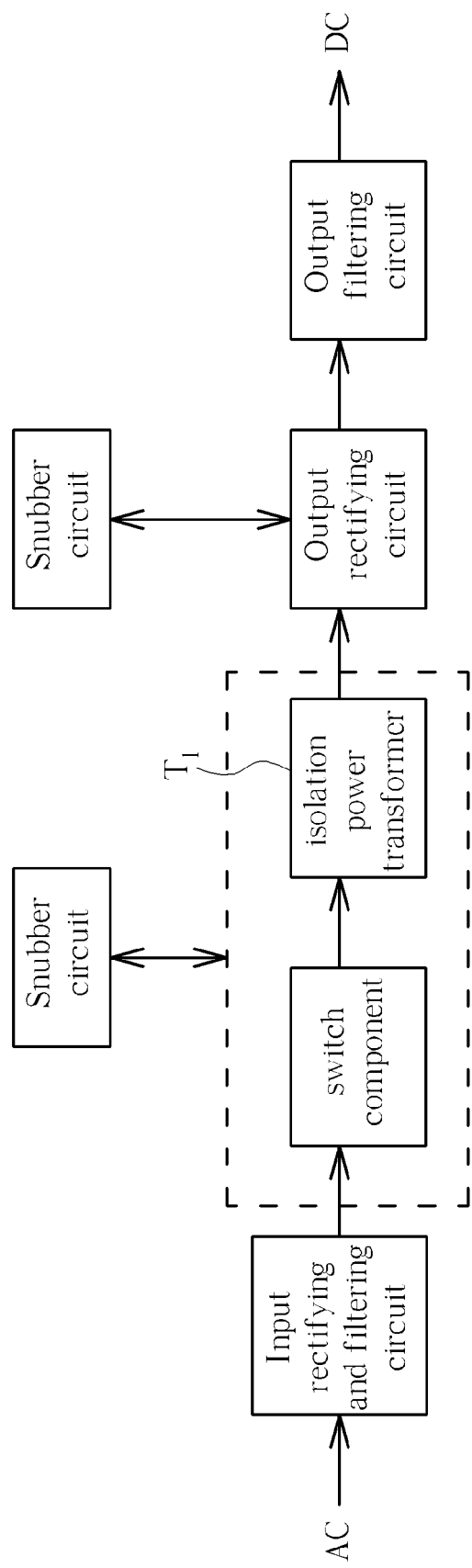
FIG. 13 is a diagram illustrating a switching power supply associated with the snubber circuit of the embodiment mentioned above.

FIG. 13 is a diagram illustrating a switching power supply associated with the snubber circuit of the embodiment mentioned above, wherein the switching power supply includes an input rectifying and filtering circuit, a switch component, an isolation power transformer $T_1$, an output rectifying circuit, and an output filtering circuit, and further includes at least one portion (e.g., part or all) of a plurality of snubber circuit 100A-100D, 200A-200D, 300A-300C. In FIG. 13, the symbol AC at the lower left corner indicates an alternating current (AC) input, and the symbol DC at the lower right corner indicates a direct current (DC) output.

Figure 14:
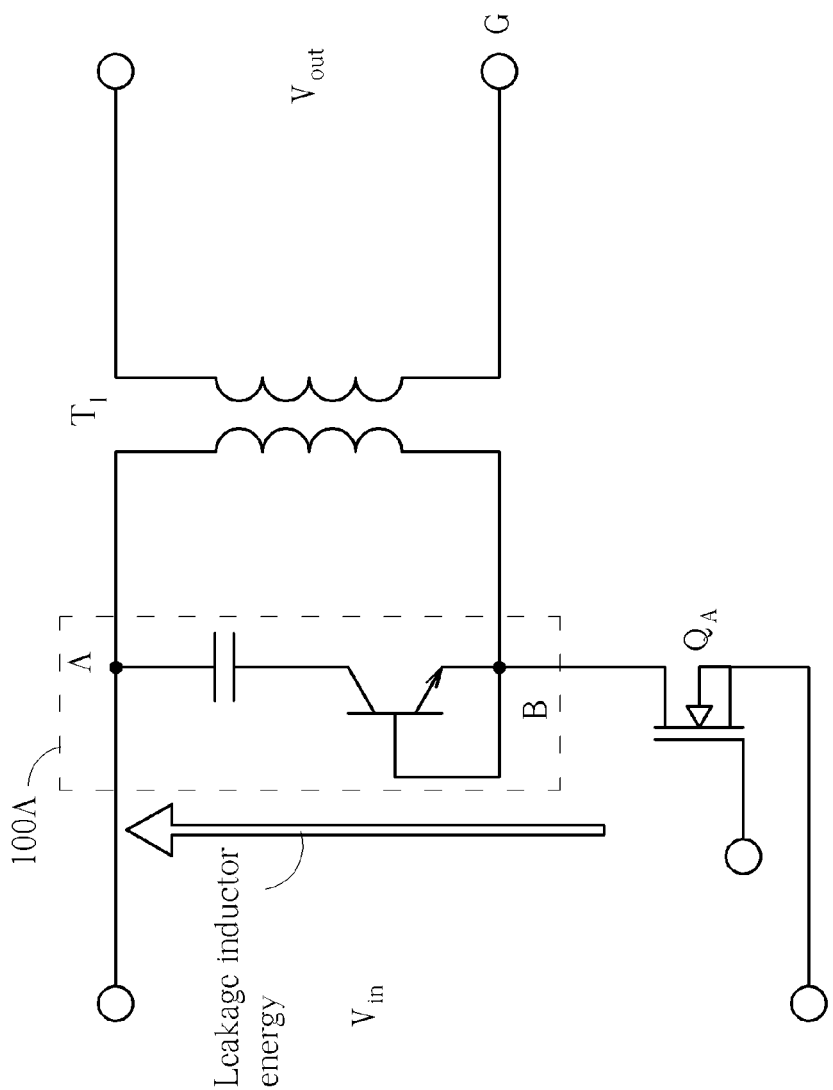
FIG. 14 is a diagram illustrating a configuration scheme of the snubber circuit shown in FIG. 2 for setting the snubber circuit at the primary side of the isolating transformer of the switching power supply shown in FIG. 13.

FIG. 14 is a diagram illustrating a configuration scheme of the snubber circuit 100A shown in FIG. 2 for setting the snubber circuit at the primary side of the isolating transformer $T_1$ of the switching power supply shown in FIG. 13, wherein the configuration scheme corresponds to the type $TYPE_1$. In FIG. 14, symbol G indicates the ground terminal, and the symbols $V_{in}$ and $V_{out}$ indicate the input voltage and the output voltage, respectively.

According to this embodiment, the snubber circuit 100A may be set at the primary side of the isolating transformer $T_1$ of the switching power supply. Especially, the snubber circuit 100A may be connected to the isolating transformer $T_1$ in parallel, and may be connected to at least one switching component (e.g., the switching component shown in FIG. 13) of the switching power supply in series. In addition, the switching component may be a switch. In this embodiment, the switch may be, for example, a MOSFET $Q_A$. However, this is for illustrative purposes only, and is not meant to be a limitation of the present invention. In accordance with some of the modifications of this embodiment, the switch may be or may be assembled by a diode, a Bipolar Junction Transistor (BJT), an Insulated Gate Bipolar Transistor (IGBT), a Static Induction Transistor (SIT), or a thyristor (which could replace the MOSFET $Q_A$). For example, based on the voltage-current characteristic of the diode, the diode could be turned on or turned off automatically in accordance with the cross voltage of the diode, and thus may be regarded as an automatic switch. The setting direction of two terminals of the diode depends on different configurations.

In this embodiment, the first terminal A of the snubber circuit 100A is electrically connected to a terminal of the primary side of the isolating transformer $T_1$, and the other terminal B is electrically connected to another terminal of the primary side of the isolating transformer $T_1$ and the switching component such as aforementioned switch (e.g., MOSFET $Q_A$), and the energy generated by the switch while switching at high frequency may be absorbed by the snubber circuit 100A for energy recycling. Especially, the snubber circuit 100A may utilize at least one of the aforementioned junction characteristic to perform the aforementioned energy recycling process. For instance, the snubber circuit 100A may transfer the leakage inductor energy to the capacitor 120 rapidly by using the characteristic of fast turning on, and push the energy of the capacitor 120 back to the source by using the characteristic of long storage time. Please note that before the above-mentioned energy recycling process, the snubber circuit 100A may reduce the resonance amplitude by using the characteristic of slow switching and the characteristic of small base-emitter junction capacitance $C_{bc}$. Therefore, the snubber circuit 100A could reduce the spike voltage (shown in FIG. 16) and work efficiently.

Figure 15:
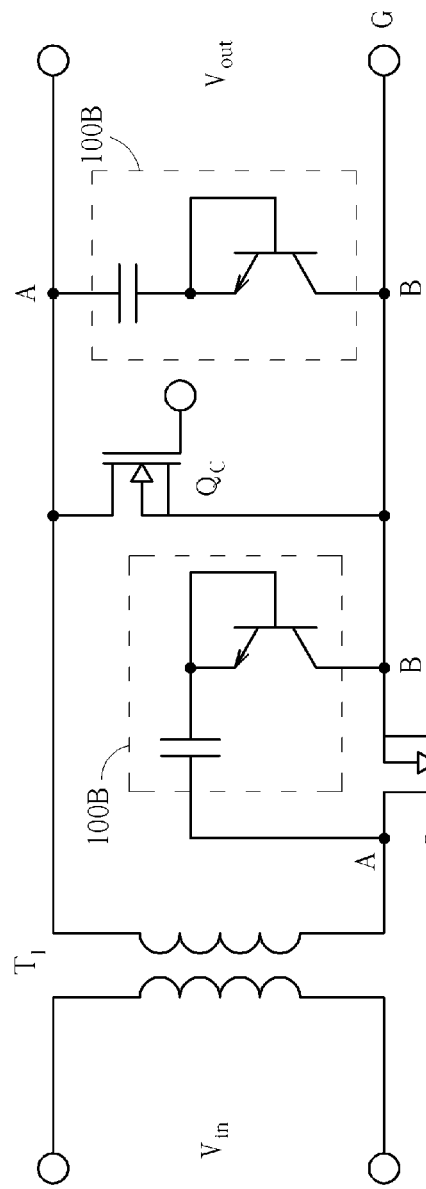
FIG. 15 is a diagram illustrating a configuration scheme of the snubber circuit shown in FIG. 3 for setting the snubber circuit at the secondary side of the isolating transformer of the switching power supply shown in FIG. 13.

FIG. 15 is a diagram illustrating a configuration scheme of the snubber circuit 100B shown in FIG. 3 for setting the snubber circuit at the secondary side of the isolating transformer $T_1$ of the switching power supply shown in FIG. 13, wherein the configuration scheme corresponds to the type $T_B$. Similarly, symbol G in FIG. 15 indicates the ground terminal, and the symbols $V_{in}$ and $V_{out}$ in FIG. 15 indicate the input voltage and the output voltage, respectively.

According to this embodiment, the snubber circuit 100B may be set at the secondary side of the isolating transformer $T_1$ of the switching power supply. Especially, when the snubber circuit 100B (corresponding to the $TYPE_2$) is set at the secondary side of the isolating transformer $T_1$, the snubber circuit 100B may be connected to a switch of the output rectifying circuit shown in FIG. 13 in parallel. Hence, the energy generated by the switch while switching at high frequency may be absorbed by the snubber circuit 100B to exploit the at least one junction characteristic mentioned above for energy recycling. For instance, the snubber circuit 100B may be connected to the MOSFET $Q_B$ in parallel to thereby protect the MOSFET $Q_B$ from spike voltage, and provide efficient operation in the condition that the switch is a MOSFET $Q_B$. Alternatively, the snubber circuit 100B may be connected to the MOSFET $Q_C$ in parallel to protect the MOSFET $Q_C$ from spike voltage, and provide efficient operation in the condition that the switch is a MOSFET $Q_C$. This is for illustrative purposes only, and is not meant to be a limitation of the present invention. In accordance with some of the modifications of the embodiment, the switch may be a diode (which may replace the MOSFET $Q_B$ or MOSFET $Q_C$ in alternative designs). For example, based on the voltage-current characteristic of the diode, the diode could be turned on or turned off automatically in accordance with the cross voltage of the diode, and thus may be regarded as an automatic switch. The setting direction of two terminals of the diode depends on different configurations.

Figure 16:
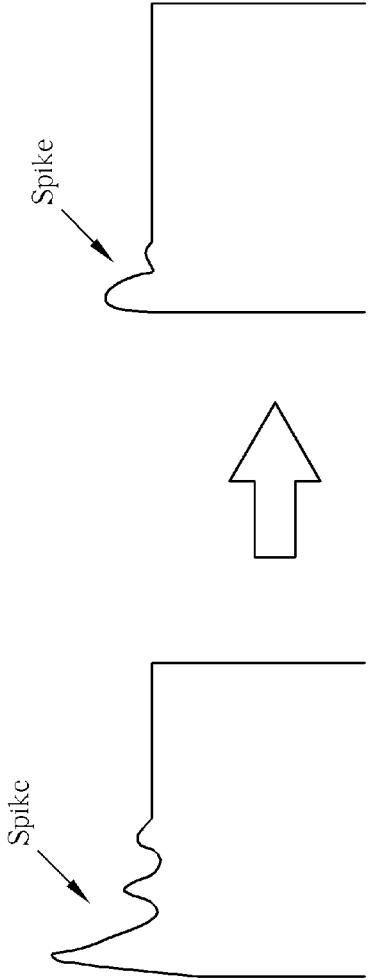
FIG. 16 is a diagram illustrating the effect of the snubber circuit suffering from spike voltage in some embodiments.

FIG. 16 is a diagram illustrating the effect of the snubber circuit (e.g., the above-mentioned CB snubber and RCB snubber) suffering from spike voltage in some embodiments. According to the aforementioned embodiments shown in FIG. 13-FIG. 15, the snubber circuit 100 may reduce spike voltage, for instance, by reducing the spike voltage of the waveform shown in the left side of FIG. 16 to the spike voltage shown in the right side of FIG. 16.

One of the advantages/benefits of the present invention is that the architecture of the snubber circuit in the present invention is simple and easy to implement, and the related technical problems can be avoided. In addition, the snubber circuit of the present invention may be connected to an active component or a load in parallel to protect the circuit connected to the load. For example, the proposed snubber circuit may be set in a switching power supply to protect the components connected to the primary side or the output rectifying circuit connected to the secondary side of the transformer. The snubber circuit especially can absorb the energy generated by the switch while switching at high frequency, provide excellent efficiency, and ensure the highest voltage surge to provide the best protection for a variety of electric/electronic components. Thus, compared to the power supply which uses conventional snubber circuit, the efficiency of the power supply which uses the snubber circuit of the present invention is improved, especially in a situation where the load is a light load.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A snubber circuit, comprising:
   a first capacitor, having a first terminal and a second terminal, wherein the first terminal of the first capacitor is electrically connected to a first terminal of the snubber circuit;
   a resistor, having a first terminal and a second terminal, wherein the first terminal of the resistor is electrically connected to the second terminal of the first capacitor; and
   a bipolar junction transistor (BJT), wherein one of an emitter and a collector of the BJT is electrically connected to the second terminal of the resistor, another of the emitter and the collector of the BJT is electrically connected to a second terminal of the snubber circuit, and a base and the emitter of the BJT are electrically conducted;
   wherein the snubber circuit further comprises a second capacitor, and the second capacitor is connected to the first terminal of the first capacitor and the second terminal of the resistor in parallel.

2. The snubber circuit of claim 1, wherein the snubber circuit is connected to an active component or a load in parallel, the active component is or is assembled by a Metal Oxide Semiconductor Field Effect Transistor (MOSFET), a diode, a Bipolar Junction Transistor (BJT), an Insulated Gate Bipolar Transistor (IGBT), a Static Induction Transistor (SIT), or a thyristor, and the load is or is assembled by an inductor, a resistor, or a capacitor.

3. The snubber circuit of claim 2, wherein when the snubber circuit is set at a primary side of a transformer, the snubber circuit is connected to the primary side of transformer in parallel and connected to at least a switch in series.

4. The snubber circuit of claim 2, wherein when the snubber circuit is set at a secondary side of a transformer, the snubber circuit is connected to a switch of an output rectifying circuit in parallel.

5. The snubber circuit of claim 1, wherein when the snubber circuit is electrically connected to a light load for enhancing the efficiency compared to a conventional snubber circuit with a light load, the light load accounts for less than 20% of full load.

6. The snubber circuit of claim 1, wherein the snubber circuit is connected to an active component or a load in parallel, the active component is or is assembled by a Metal Oxide Semiconductor Field Effect Transistor (MOSFET), a diode, a Bipolar Junction Transistor (BJT), an Insulated Gate Bipolar Transistor (IGBT), a Static Induction Transistor (SIT), or a thyristor, and the load is or is assembled by an inductor, a resistor, or a capacitor.

7. The snubber circuit of claim 6, wherein when the snubber circuit is set at a primary side of a transformer, the snubber circuit is connected to the primary side of transformer in parallel and connected to at least a switch in series.

8. The snubber circuit of claim 6, wherein when the snubber circuit is set at a secondary side of a transformer, the snubber circuit is connected to a switch of an output rectifying circuit in parallel.

9. The snubber circuit of claim 6, wherein when the snubber circuit is electrically connected to a light load for enhancing the efficiency compared to a conventional snubber circuit with a light load, the light load accounts for less than 20% of full load.

* * * * *